United States Patent [19]

Donaldson et al.

[11] Patent Number: 4,537,990

[45] Date of Patent: Aug. 27, 1985

[54] METHOD FOR GROWING SINGLE CRYSTALS OF UREA

[75] Inventors: William R. Donaldson; Chung L. Tang, both of Ithaca, N.Y.

[73] Assignee: Cornell Research Foundation, Inc., Ithaca, N.Y.

[21] Appl. No.: 478,601

[22] Filed: Mar. 24, 1983

[51] Int. Cl.³ .............................................. C30B 7/08
[52] U.S. Cl. .............................. 564/63; 156/DIG. 65; 156/DIG. 113
[58] Field of Search ..... 156/621, DIG. 98, DIG. 113, 156/DIG. 65; 564/63, 73; 260/DIG. 35, 707

[56] References Cited

U.S. PATENT DOCUMENTS 1,906,758  5/1933  Kjellgren .............................. 156/621

OTHER PUBLICATIONS

Betzler et al., *J. of Mol. Structure*, 47 (1978) 393–396.
Bauerle et al., *Phys. Stat. Sol.*, (a) 42 (1977) K–119.
Kurtz et al., *J. of Appl. Phys.*, 39 (1968) 3798–3813.
Gaedeke et al., *Krist. U. Tech.* 15 (1980) 557–564.
Lee et al., *J. of Crystal Growth*, 32 (1976) 363–370.
Gaedeke et al., *Krist. U. Tech.*, 14 (1979) 913–922.
Bunn, *Proc. Roy. Soc. London*, A–141 (1933) 567–593.

*Primary Examiner*—Hiram H. Bernstein

[57] ABSTRACT

This invention relates to growing single crystals of urea having increased dimensions on the 110-$\overline{1}$10 faces by physically restricting growth of the 111 faces of a seed crystal while precipitating urea from a saturated alcoholic solution containing ammonium bromide. In addition, this invention relates to a seed crystal holder adapted to modify crystal habit during crystal growth.

2 Claims, 4 Drawing Figures

METHOD FOR GROWING SINGLE CRYSTALS OF UREA

GOVERNMENT GRANT INFORMATION

A portion of the research related to this invention was funded by NSF Grant No. DMR 76-81083

BACKGROUND OF THE INVENTION

Urea crystals, best grown from alcoholic solution, have a long primatic needle-like formation (see FIG. 1), which is caused by rapid crystal growth on the 111 crystal face. Unfortunately for laser use, it is desirable that crystals having significant dimensions on the 110 and 110 faces be available.

Certain materials including ammonium bromide have been indicated as solution additives which retard growth at the 111 face of a urea crystal. Nevertheless, relatively rapid, consistent production of single urea crystals having substantial 110 and 110 dimensions has not been demonstrated in the art.

Bunn, *Proc. Roy. Soc. London*, A-141 (1933) 567–593 describes the use of solution additives to modify crystal habit and particularly teaches that NH$_4$Cl and NH$_4$Br (the latter more strongly) cause the formation of basal planes which reduce or obliterate the 111 faces of urea crystals formed from alcoholic solutions (see FIG. 2).

Gaedeke et al., *Krist U. Tech.*, 14 (1979) 913–922; and *Krist. U. Tech.*, 15 (1980) 557–564 describe the effect of various additives on the crystal habit and transportation and storage properties of urea.

Lee et al., *J. of Crystal Growth*, 32 (1976) 363–370 report a study of the nucleation and growth of urea from water-alcohol solvent mixtures.

Kurtz et al., *J. of Appl. Phys.*, 39 (1968) 3798–3813; Betzler et al., *J. of Mol. Structure*, 47 (1978) 393–396; and Bauerle et al., *Phys. Stat. Sol.*, (a) 42 (1977) K-119 report second harmonic characteristics of urea crystals.

DESCRIPTION OF THE INVENTION

This invention relates to growing single crystals of urea having increased dimensions on the 110-110 faces by physically restricting urea from a saturated alcoholic solution containing ammonium bromide.

The process of the invention comprises growing a urea crystal upon a seed crystal, mounted to prevent growth in the $\hat{Z}$ axis direction, by reducing the temperature of a saturated alcoholic solution of urea containing ammonium bromide causing growth of a single urea crystal on the 110, 110 faces of the seed crystal.

Figure 1:
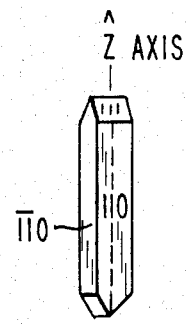
FIG. 1 is a representation of a typical urea crystal.
Figure 2:
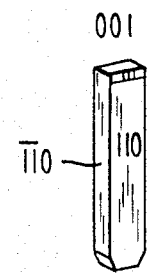
FIG. 2 is a representation of a urea crystal grown under the influence of ammonium bromide.
Figure 3:
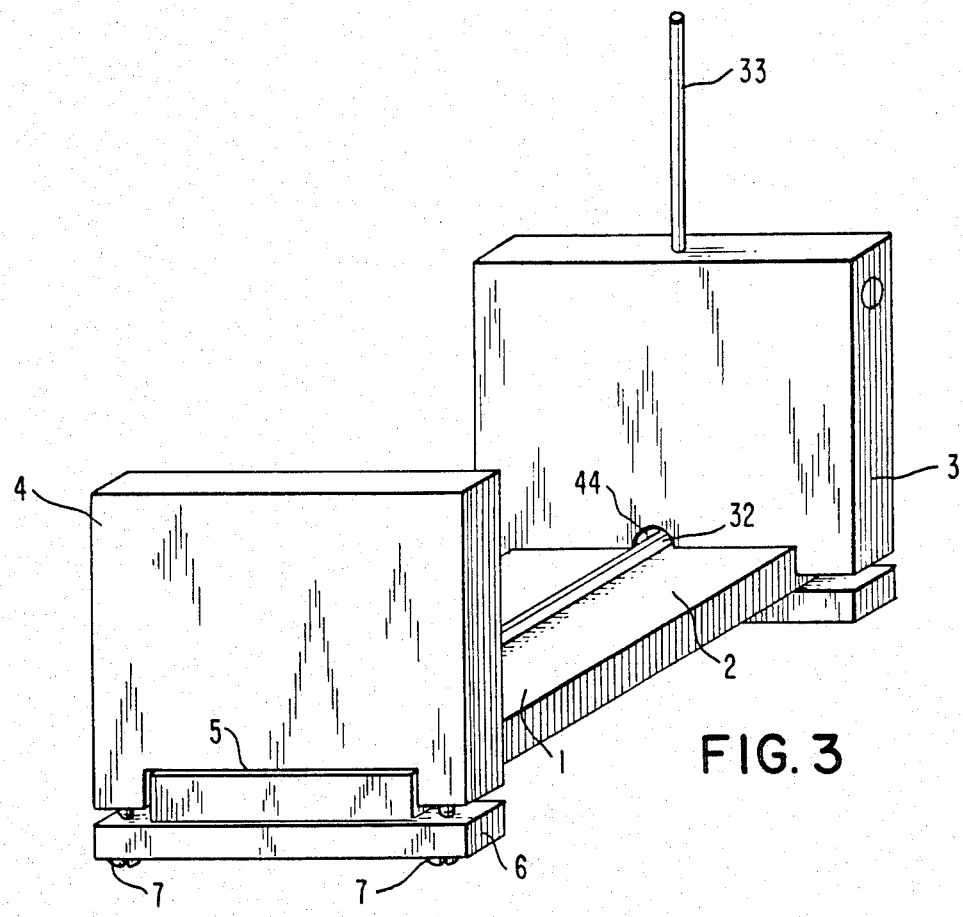
FIG. 3 is a representation of the seed crystal holder of the invention.

With reference to FIG. 3, in the crystal growth process of the invention a seed crystal is mounted upon a holder 1 defined by a flat base 2 which is wider than the ultimate width of the crystal to be grown. Both ends of the $\hat{Z}$ axis of the seed crystal are in direct contact with fixed end plates 3 and 4, to prevent crystal growth in the $\hat{Z}$-axis direction. The end plates have a height and width greater than the ultimate height and width of the crystal to be grown. The end plates 3 and 4 are essentially parallel to the $\hat{Z}$ axis of the seed crystal and essentially perpendicular to and tightly fit against the flat base upon which the seed crystal is mounted. While the end plates are at least fixed during crystal growth, preferably at least one of the end plates is movable along the flat base 2 to allow for ready adjustment of the end plates against the crystal surface upon which growth is sought to be restricted. In the presently preferred embodiment, a notch 5 snugly conforms to the configuration of the flat surface 1 is employed in end plate 4. End plate 4 is wider than base 2 and is movably secured through pressure generated by backing plate 6 and fastener means (e.g. screws) 7. Each end plate contains a hole or indentation 44 having a cross-section which conforms to the cross-section of the seed crystal 32 to hold the seed crystal in place against the base 2 and end plates 3 and 4.

The seed crystal holder can be formed from any relatively rigid material which is inert to the crystal growth solution and which retards the formation of unwanted nucleation centers. Teflon is the presently preferred material.

The seed crystal holder of the invention provides several unique benefits. Before crystal growth starts, it is important to dissolve back the seed slightly to remove unwanted nucleation centers that may exist on the seed crystal. This often makes it difficult to suspend the seeds using strings or wires as is commonly taught; for example if too much dissolution is attempted the seed crystal comes loose. An advantage is obtained over the string or wire technique in that the grown crystal does not have a seed in the middle of the crystal, but rather at one surface.

While the crystal holder has been described as particularly useful in growing single urea crystals, the seed holder has wide utility in modifying the growth habits of a variety of crystals. Thus, broadly the end plates can be fixed against the surfaces of any seed crystal perpendicular to the axis along which crystal growth is sought to be restricted, thus allowing crystal growth to occur only on the remaining exposed surfaces of the seed crystal.

In the crystal growth process of the invention, the mounted seed crystal is suspended in a saturated alcoholic solution of urea containing ammonium bromide and the temperature slowly reduced, to cause growth of a single crystal upon the seed crystal.

The lower alkanol solvent preferably is methanol, however, less preferred solvents include ethanol, methanol-ethanol mixtures and mixtures of methanol with other lower alkanols and glycerol. Preferably where methanol mixtures are employed the mixture comprises about 5% by weight or less and preferably 2% or less of the co-solvent. Preferably the alcoholic solvents are anhydrous although in less preferred embodiments, small amounts of water, preferably less than 2% by weight, can be present.

It has been found that the presence of ammonium bromide substantially increases the quality of the crystal grown. Some small amount of ammonium bromide is apparently incorporated into the crystal formed. Large amounts of ammonium bromide incorporated into the crystal adversely affect the light absorption characteristics of the urea crystal. Thus, the amount of ammonium bromide incorporated into the saturated urea solution should be a crystal quality enhancing amount of ammonium bromide which is less than an amount which forms a final ammonium bromide crystal growth solution; that is, a solution at the end of the desired growth process which is saturated with ammonium bromide. Explained another way, should the final crystal solution be saturated with ammonium bromide distinct coprecipitation of ammonium bromide would result, markedly changing the absorption characteristics of the resultant crystal. The urea crystals formed by the process of the invention typically contain about 0.01% or less of bromine.

Typically, for example, the amount of ammonium bromide employed in methanol solutions, is between about 34.8 and 31 grams per liter and most preferably about 31.6 grams per liter.

The precise effect of ammonium bromide is not fully understood. While ammonium bromide has been shown to retard growth along the $\hat{Z}$ axis of urea crystals, the physical restraint might be considered to provide the same effect. Nevertheless, the presence of ammonium bromide significantly reduces the size of vales which appear in the crystal as cones with their base at the end plates with the apexes extending toward the center of the crystal, thus providing more clear crystal area. It is thought that since the single crystal growth in question proceeds over several months, the urea solution becomes unstable, the urea decomposing to form ammonia. The ammonium ion would alter the decomposition equilibrium. However, the presence of equivalent amounts of ammonium chloride or dissolved ammonia gas do not provide the same apparent results on crystal quality.

The crystal growth solution is a solution saturated with urea at a given first temperature and containing a crystal quality enhancing amount of $NH_4Br$. It is preferably formed in a vessel separate from the crystal growth vessel, by first dissolving the ammonium bromide in the solvent, e.g. methanol, and then stirring the solvent at the given first temperature in the presence of a saturating excess of urea until a saturated solution is obtained. In this preferred procedure, the saturated solution is then delivered to the crystal growth vessel through delivery means maintained at a temperature sufficiently above the first given temperature so as to avoid nucleation during transfer. The solution is also filtered to remove particulate material before its introduction into the crystal growth vessel.

It is preferred that the mounted seed crystals not contact the saturated urea solution until it has been placed in the crystal growth vessel and equilibrated. Once the solution is in the crystal growth vessel, the mounted seed crystal is exposed to the solution at a second given temperature above the first temperature for a time sufficient to dissolve a portion of the seed crystal at the exposed surfaces to remove possible unwanted nucleation sites. The temperature of the crystal growth solution is then lowered until crystal regrowth occurs. The temperature is continually lowered in small crystal growth rate controlling increments to cause a single crystal to grow upon the seed crystal. The exact temperature increments are in part a function of the seed size and the solution characteristics. Optimum rates can be readily determined. As the crystal surface grows, the rate of temperature reduction can be increased.

During the crystal growth period the solution should be gently stirred to assure solution uniformity. Further, in order to avoid irregular growth, it is highly desirable to periodically pass the solution about the seed crystal in alternating directions, such as by reversing the direction of the stirring means at relatively short intervals.

When the crystals have grown to desired dimensions at a final crystal growth bath temperature, the crystals are removed from the solution, washed and carefully dried.

The first temperature of the crystallization crystal growth solution is not unduly critical. However, due to the volatility of the solvent and the need for close temperature, it is preferred that the first temperature be about normal room temperature and preferably slightly above room temperature. Temperature control means either heating or cooling are well known in the art and can be selected and adapted to provide the temperatures and degree of temperature control required by this process.

As unwanted nucleation sites are not desired, the vessels, and other equipment and components, should be formed from or coated with materials which do not promote nucleation. Further, the materials of construction, especially those in prolonged contact with the crystal growth solution should be substantially inert to the solutions. Teflon and glass, among others, are such materials. Transfer tubing and the like which does not come into prolonged contact with the crystal growth solution can be formed from stainless steel and other relatively inert materials.

Figure 4:
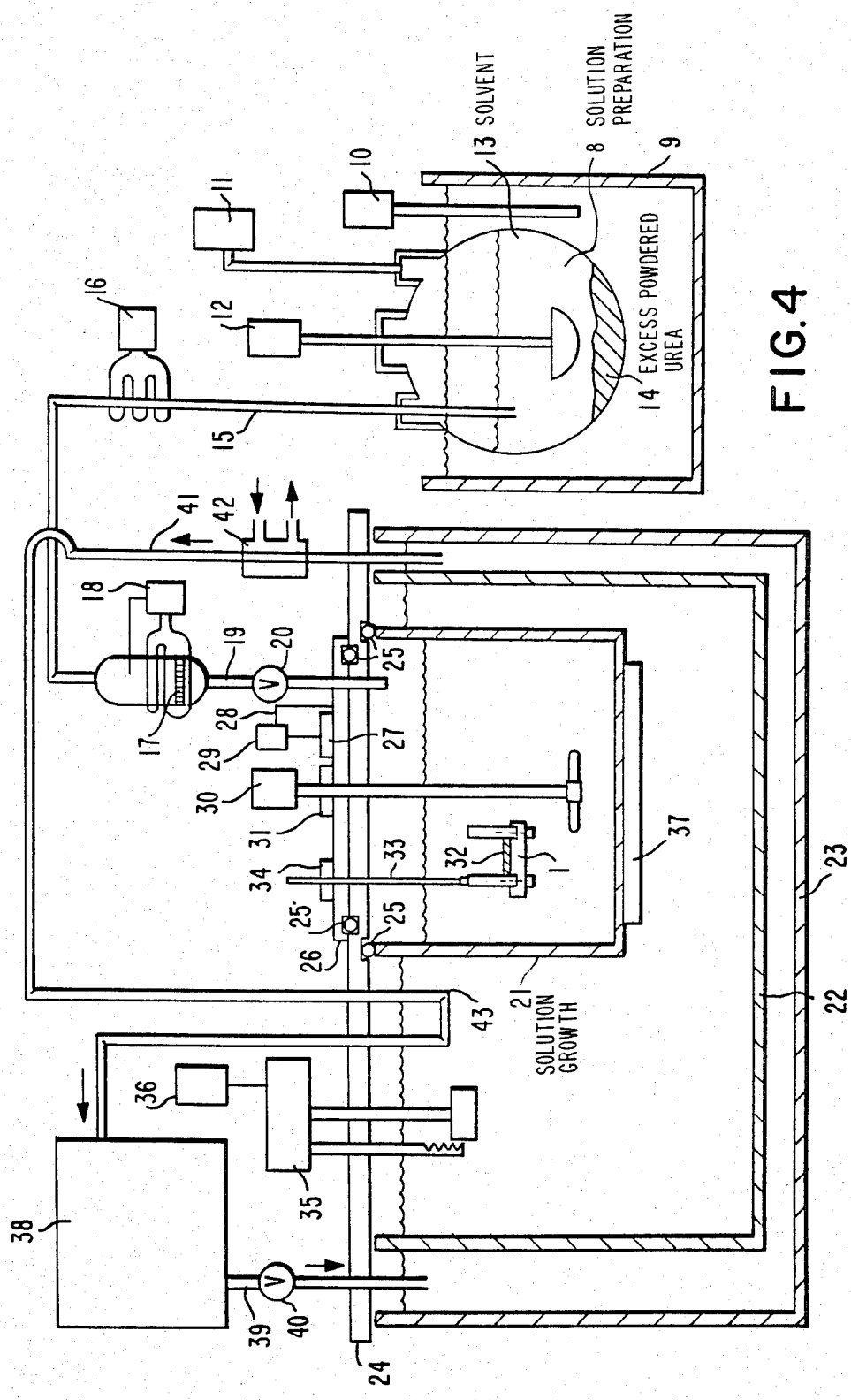
FIG. 4 is a schematic representation of the crystal growth apparatus employed in the process of the invention.

The presently preferred crystal growth apparatus is schematically shown in FIG. 4 and comprises:

A solution preparation flask 8 in a water bath 9, containing a constant temperature controller 10. The flask 8 is equipped with a pressurized inert gas (e.g. argon) source 11, a stirrer 12 and a transfer tube 15. As shown the flask contains solvent 13 and excess powdered urea 14. The transfer tube 15, adapted to transfer solution under gas pressure, is heated by a heater 16 and communicates to sintered glass filter 17, which is also heated by a temperature sensing and controlling heater 18. Filtered solution is passed through tubing 19 containing valve 20 into solution growth chamber 21, contained in a temperature controlled inner bath 22, which in turn is contained in a temperature controlled water jacket 23.

The entire bath assembly is covered by a lid 24 to which the solution growth chamber is sealed (e.g. Vitron O-ring seals) 25. A top plate 26 is sealed to the lid above the growth chamber. The top plate is heated by heater 27, controlled by temperature probe 28 and temperature controller 29. A stirrer 30 (e.g. shaft and blade of Teflon) is movably mounted in the growth chamber through shaft port 31. A seed crystal mount 1 containing seed crystal 32 is movably mounted in the growth chamber by means of a movable rod 33 which passes through sealable port 34. During operation, the solution growth chamber is essentially sealed and maintained under an inert gas (e.g. argon atmosphere). The growth chamber is also equipped with a bottom heater 37. The temperature controlled inner bath 22 is temperature controlled for example, by a Thermomix 1850 control unit 35 which provides stirring and temperature control coupled with a digital temperature ramp programmer 36.

The outer temperature control jacket is equipped with a temperature controller 38, which supplies water to the jacket through line 39 and valve 40. The water in the outer jacket is returned to the controller 38 via line 41 through a constant temperature heat exchanger 42, and through a heat exchanger 43 between the return line and the inner bath.

EXAMPLE

The apparatus employed is that shown in FIG. 4.

A saturated urea solution was formed from urea (USP) recrystallized electronic grade methanol. The recrystallized urea powder was dried under vacuum at 40° C. $NH_4Br$ (A.C.S. grade) was likewise recrystallized from electronic grade methanol. A crystal growth solution was then formed by dissolving 31.6 grams of $NH_4Br$ per liter of electronic grade methanol in a glass container. 295 grams of urea per liter of methanol were then added to the container. (Sufficient urea to ensure that there was undissolved urea powder in the container when the solution became saturated.) Alternatively, the urea and $NH_4Br$ can be added simultaneously. The container was then sealed and placed in a constant temperature water bath at 29.05° C.±0.008° C. The solution was vigorously stirred for three days while maintaining the temperature. The sealing means on the container had sealable port means for subsequent transfer of the saturated solution.

The crystallization apparatus employed is schematically shown in FIG. 4, it consisted of a triple bath (21, 22, 23). Bath 21 was temperature controlled to ±0.2° C. Bath 22 was temperature controlled to 0.004° C. Bath 23 is the growth bath. Additional local heaters 37 were located near the bottom of bath 23 to dissolve possible unwanted nucleation centers and to dissolve back the seed crystal. The tops of the baths were made of stainless steel. A Vitron O-ring was placed between them to ensure a chemically inert airtight seal. The top plate had a filling port and an evacuation port sealably communicating with bath 23 that enabled the urea crystal solution growth solution to be transferred into bath 23 without exposure to air. The top plate had its own heater 27, which was controlled by an "on-off" type temperature regulator with a thermometer probe in the plate with a measured regulation of 0.076° C. Individual seed crystals were mounted on a plurality of Teflon seed crystal mounting means as in FIG. 3, having a base 1.1 inches wide, with the end plates abutting the ends of the $\hat{Z}$ axis of the seed crystal being effectively 1 inch high.

To begin the crystallization, the seed crystal holders containing seed crystals were vertically movably mounted in the growth chamber with their bases essentially horizontal.

The saturated urea solution formed above was transferred into growth chamber 23, wherein the atmosphere had been saturated with methanol through suitable tubing connecting the ports in each vessel by pressurizing the solution container 8 with argon saturated with methanol to force the solution through the tubing into the growth chamber 23. The delivery tubing was maintained at 2° C. above the solution temperature by use of heating means. The delivery line contained a filter means 17, (20-micron sintered glass filter) to remove any undissolved material from the solution before it entered the growth chamber.

The seeds on their holders were held above the solution surface in the growth chamber during the transfer process to prevent the seeds from dissolving.

The system was maintained under a positive pressure of argon saturated with methanol.

The solution was allowed to cool to 0.2° C. above the saturation temperature of the solution. The seed crystals on their holders were then inserted into the solution. This temperature was maintained for about two days to dissolve any microcrystals on the surface of the seed crystals. After this, the temperature was reduced to the saturation point and then dropped at a rate of 62-40 M° C. per day for approximately two days, to produce a level of supersaturation in the solution which caused crystal growth to occur. At the first sign of regrowth, the cooling rate was reduced to 0.009° C./day. After about one month, the seeds having grown large enough to tolerate a higher growth rate, the cooling rate was increased to 0.0103° C./day.

During the entire growth period, the solution was stirred in alternate directions at the rate of 3 rpm with a rotation reversal every three minutes. After two months, the resultant single crystals were blocks having the following dimensions: (data collected from multiple experiments)

| Seed Crystal Size (MM) (110) × (1-10) × (001) | Exposed Seed Crystal Length* (MM) | Grown Crystal Size (MM) (110) × (1-10) × (001) | Maximum Clear Volume in Crystal (MM) (110) × (1-10) × (001) |
| --- | --- | --- | --- |
| 1.524 × 1.524 × 24.5 | 13 | 10 × 12 × 13 | 6 × 12 × 13 |
| 0.254 × 1.524 × 21.08 | 13 | 11 × 13 × 13 | 5 × 13 × 11 |
| 4.064 × 2.413 × 26.67 | 17 | 13 × 11 × 17 | 13 × 8 × 17 |
| 2.540 × 1.270 × 24.13 | 15 | 5 × 5 × 15 | 3 × 5 × 15 |

*The remainder length (001) of the seed crystal was inserted into the crystal holder end plates.

What is claimed:

1. A process for growing single urea crystals having an altered crystal habit with significant dimensions on the 110 and 110 faces which comprises growing a urea crystal upon a seed crystal from an alcoholic solution of urea containing a crystal quality enhancing amount of ammonium bromide less than an amount which would saturate the crystal growth solution at the lowest crystal growth temperature employed while covering the ends of the growing crystal along the $\hat{Z}$ axis throughout the crystal growth process to prevent growth of the crystal along the $\hat{Z}$ axis, thereby providing a urea crystal adapted for laser use.

2. A process as in claim 1 wherein the solvent of the alcoholic solution is methanol.

* * * * *